United States Patent [19]

Sapir

[11] 3,976,954
[45] Aug. 24, 1976

[54] ANTI-SKID BRAKE CONTROL SYSTEM AND COMPONENTS THEREOF

[75] Inventor: Said Sapir, Los Angeles, Calif.

[73] Assignee: International Telephone and Telegraph Corporation, New York, N.Y.

[22] Filed: Apr. 14, 1975

[21] Appl. No.: 567,497

Related U.S. Application Data

[62] Division of Ser. No. 495,226, Aug. 6, 1974.

[52] U.S. Cl. .............................. 330/69; 330/30 D; 330/83; 330/84
[51] Int. Cl.² .......................................... H03F 3/45
[58] Field of Search ................ 307/235 F, 235 R; 330/9, 30 D, 69, 83, 84

[56] References Cited

UNITED STATES PATENTS

| 3,456,128 | 7/1969 | Myers | 330/30 D X |
| 3,714,603 | 1/1973 | Williford | 330/9 X |
| 3,833,859 | 9/1974 | Carlson | 330/69 |

*Primary Examiner*—R. V. Rolinec
*Assistant Examiner*—Lawrence J. Dahl
*Attorney, Agent, or Firm*—A. Donald Stolzy

[57] ABSTRACT

An anti-skid brake control system having two wheel velocity pick-up coils connected to respective common mode rejection circuits. A coil open detector including a Norton amplifier is also connected from the said circuits to disable the system controller should an open develop in one of the pick-up coils.

1 Claim, 4 Drawing Figures

ANTI-SKID BRAKE CONTROL SYSTEM AND COMPONENTS THEREOF

This application is a division of copending parent application Ser. No. 495,226 filed Aug. 6, 1974. The benefit of the filing date of said copending application is, therefore, hereby claimed for this application.

BACKGROUND OF THE INVENTION

This invention relates to brake control systems, and more particularly, to anti-skid brake control systems and a common mode rejection circuit for use in such a system or anywhere.

In the past, and especially on large trucks, it has been the practice in conventional anti-skid brake control systems to run long electrical leads from a wheel velocity pick-up coil at a wheel to a controller located a considerable distance away from the coil. The length of these leads causes them to pick up substantial noise from ignition coils, other sources of radiation and otherwise.

Pick-up coil opens also have caused hazards and inaccuracies in the said conventional systems.

SUMMARY OF THE INVENTION

In accordance with the present invention, the above-described and other disadvantages of the prior art are overcome by providing a common mode rejection circuit having a differential amplifier and high and low potential resistors connected from the long leads to suppress noise picked up by the long leads.

Another feature of the present invention resides in the use of a coil open detector with two of the common mode rejection circuits.

The above-described and other advantages of the present invention will be better understood from the following detailed description when considered in connection with the accompanying drawings.

BRIEF DESCRIPTION OF THE DRAWINGS

In the drawings which are to be regarded as merely illustrative.

DESCRIPTION OF THE PREFERRED EMBODIMENTS

Figure 1:
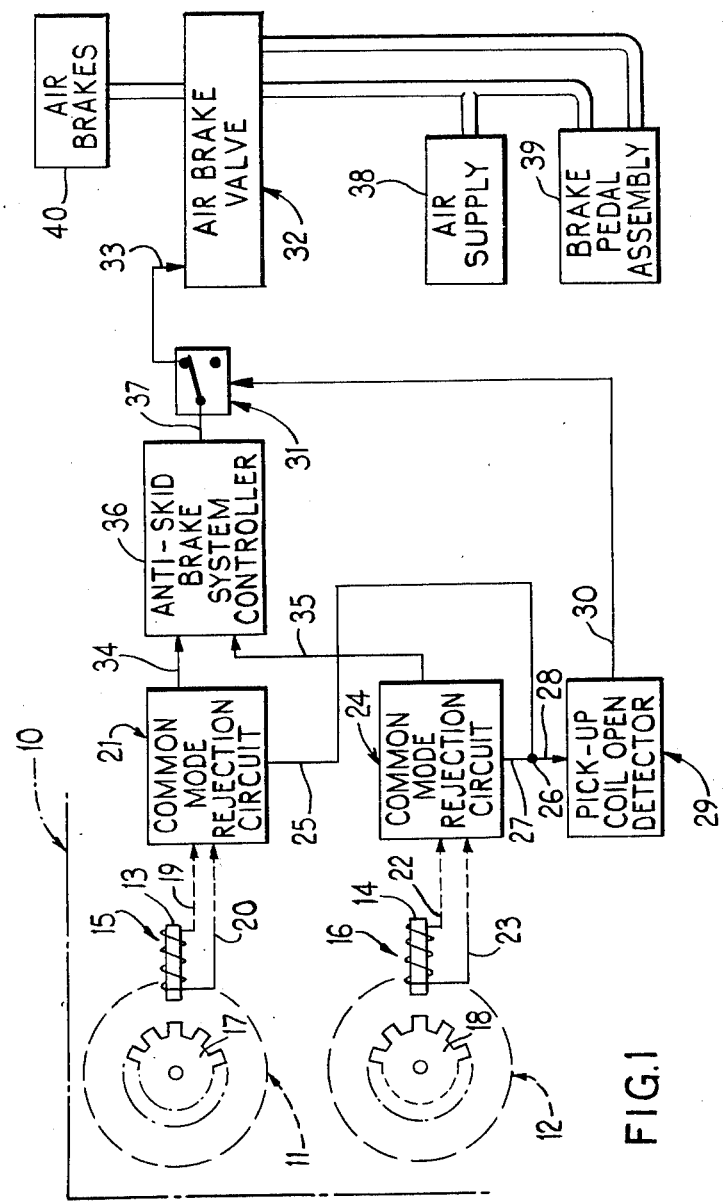
FIG. 1 is a block diagram of one embodiment of the present invention.

In FIG. 1, a motor vehicle is illustrated at 10 having wheels 11 and 12. Permanent magnets 13 and 14 are mounted on the chassis of the vehicle. Coils 15 and 16 are wound around permanent magnets 13 and 14, respectively. Ferromagnetic rotors 17 and 18 are fixed to wheels 11 and 12, respectively.

Coil 15 has long leads 19 and 20 connected to a remote common mode rejection circuit 21.

Coil 16 has long leads 22 and 23 connected to a remote common mode rejection circuit 24.

Circuit 21 has an output lead 25 connected to a junction 26. Circuit 24 has an output lead 27 connected to the same junction 26. Lead 28 is connected from junction 26 to a pick-up coil open detector 29 and provides an input thereto thereon.

Detector 29 has an output lead 30 which is connected to and forms an input lead to a switch 31 that may be a relay or an electronic or transistor switch. An air brake valve is provided at 32. Valve 32 is a solenoid valve and has a winding to which an input lead 33 thereto is connected. Circuits 21 and 24 have other output leads 34 and 35, respectively, which leads 34 and 35 are connected to and provide inputs to an anti-skid brake system controller 36.

Controller 36 has an output lead 37 which is connected to valve input lead 33 through switch 31.

An air supply is provided at 38 and is connected both to valve 32 and to a brake pedal assembly 39. Brake pedal assembly 39 is also connected to valve 32. A set of air brakes 40 is connected from valve 32.

OPERATION

In the operation of the anti-skid brake control system illustrated in FIG. 1, circuits 21 and 24 produce output pulses at respective pulse repetition frequencies directly proportional to the speeds of wheels 11 and 12, respectively. At the same time, circuits 21 and 24 suppress noise picked up by leads 19, 20, 22 and 23.

When the pedal of assembly 39 is depressed, the air brakes 40 are operated. On the other hand, if a skid is imminent, controller 36 periodically, for a short or long time, operates valve 32 to release air brakes 40.

Should an open develop in either one or both of the coils 15 or 16, detector 29 then disables controller 36 by opening switch 31 and preventing controller 36 from controlling the valve 32 through the input connection thereto indicated at 33.

Switch 31 is an entirely conventional self-locking relay or latching electronic or transistor switch which latches in the open position when actuated to that position by detector 29, and, upon removal of power and the subsequent reapplication thereof, moves the switch back to its unlatched position. For example, switch 31 is shown in its unlatched position in FIG. 1.

Figure 2:
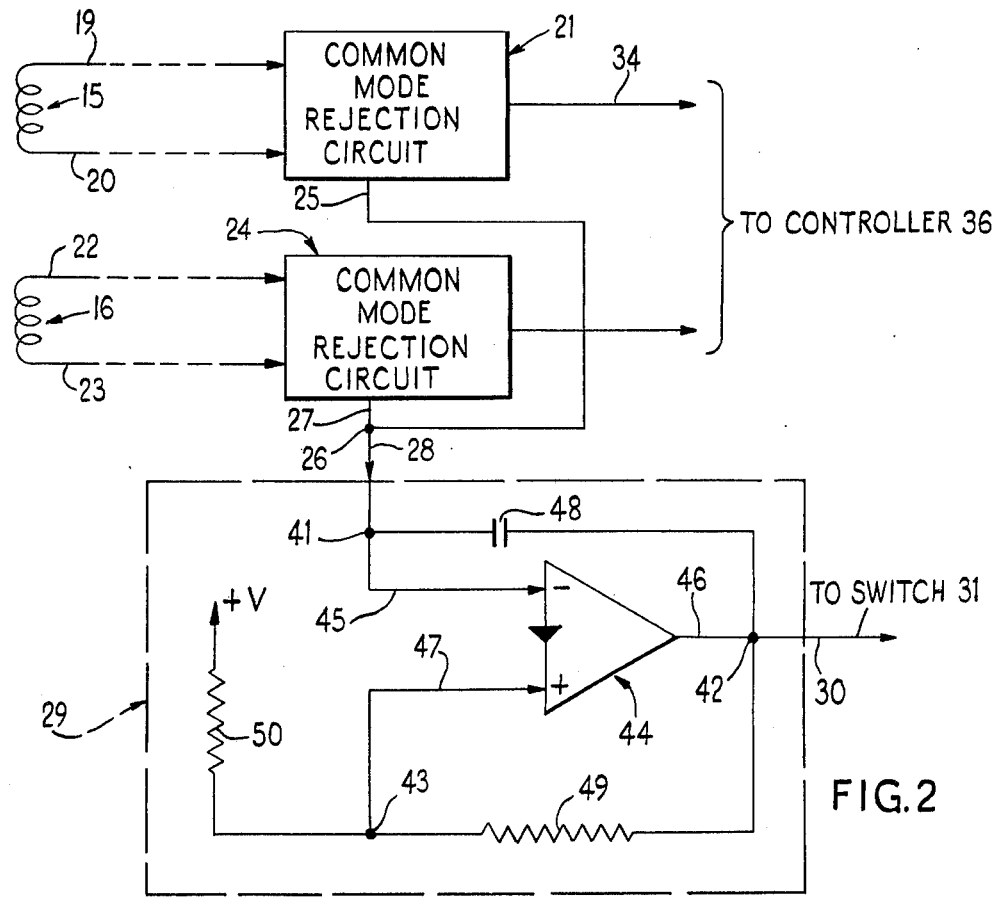
FIG. 2 is a schematic diagram of a portion of the invention illustrated in FIG. 1.

Some of the detail of detector 29 is shown in FIG. 2.

In FIG. 2, detector 29 is shown having three junctions 41, 42 and 43. Junction 41 is connected from junction 28. Detector 29 also includes a Norton amplifier 44 having an inverting input lead 45 connected from junction 41, an output lead 46 connected to junction 42, and a non-inverting input lead 47 connected from junction 43.

A capacitor 48 is connected between junctions 41 and 42. Output lead 30 is connected from junction 42 to switch 31. A feedback resistor 49 is connected between junctions 42 and 43. A resistor 50 is connected from junction 43 to a point of a constant potential +V which is a regulated D.C. voltage of a potential different from ground, positive or negative.

Figure 3:
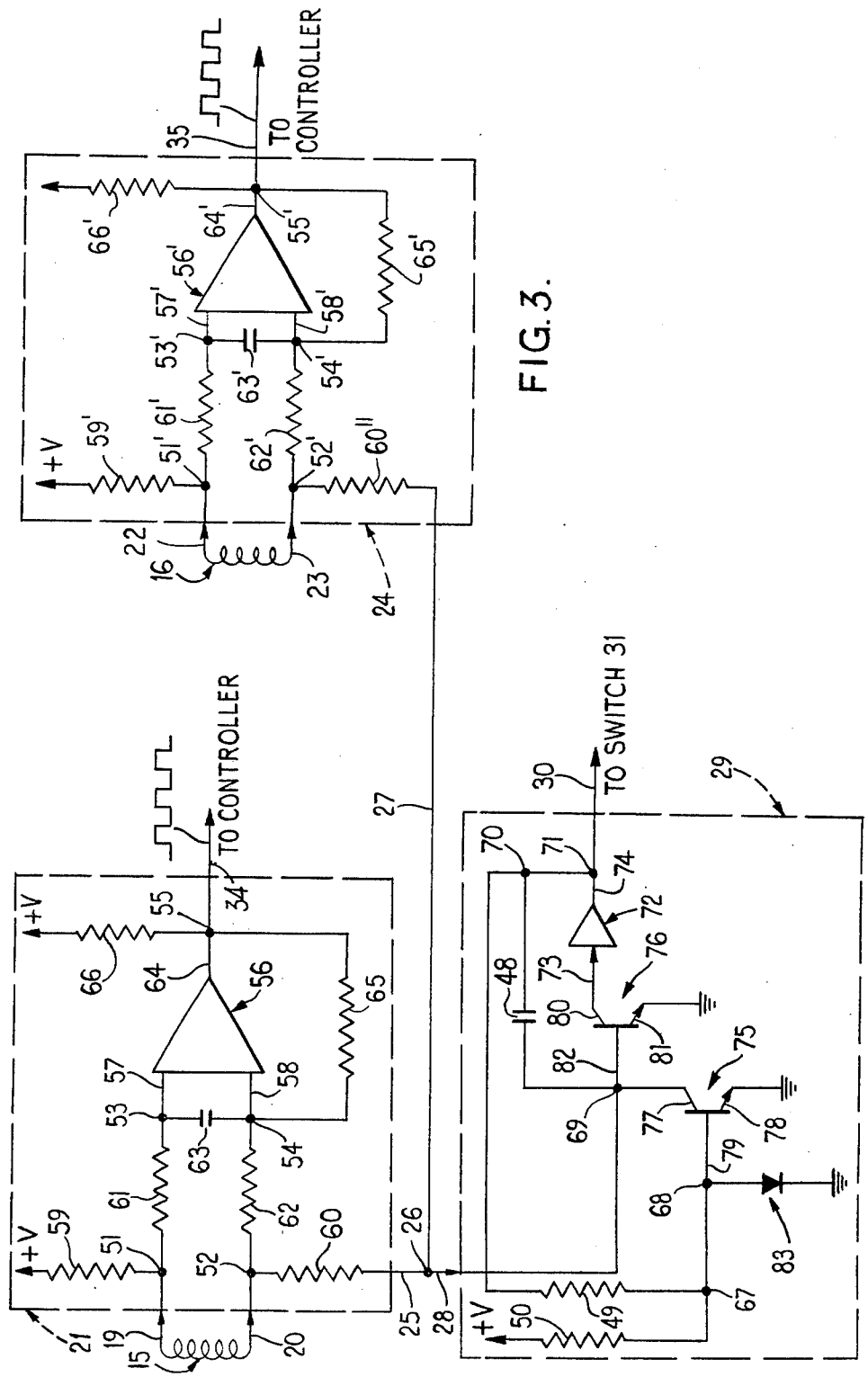
FIG. 3 is a schematic diagram of two common mode rejection circuits constructed in accordance with the present invention and a schematic diagram of a pick-up coil open detector connected therefrom.

In FIG. 3, circuits 21 and 24, and detector 29, are shown again with coils 15 and 16. Circuits 21 and 24 may be identical, if desired. Thus, only circuit 21 will be described in detail in FIG. 3.

Circuit 21 has junctions 51, 52, 53, 54 and 55. Circuit 21 also has a differential amplifier 56 with an inverting input lead 57 connected from junction 53 and a non-inverting input lead 58 connected from junction 54. Leads 19 and 20 of coil 15 are connected respectively to junctions 51 and 52. A resistor 59 is connected from junction 51 to potential +V. A resistor 60 is connected between junctions 52 and 26, junction 26 in FIGS. 2 and 3 being a virtual ground.

A resistor 61 is connected between junctions 51 and 53. A resistor 62 is connected between junctions 52 and 54. A capacitor 63 is connected between junctions 53 and 54.

Amplifier 56 has an output lead 64 connected to junction 55. A feedback resistor 65 is connected between junctions 54 and 55. A resistor 66 is connected from junction 55 to a point of potential +V.

Detector 29 has junctions 67, 68, 69, 70 and 71. Detector 29 also has a non-inverting amplifier 72 with an input lead 73 and an output lead 74. Output lead 74 is connected to junction 71. Junctions 70 and 71 are connected together. Output lead 30 is connected from junction 71.

Detector 29 also includes NPN transistors 75 and 76. Transistor 75 has a collector 77 connected from junction 69, an emitter 78 which is grounded and a base 79 which is connected from junction 68. Junctions 67 and 68 are connected together.

Transistor 76 has a collector 80 connected to amplifier input lead 73, an emitter 81 which is grounded and a base 82 which is connected from junction 69. The resistor 50 is again shown in FIG. 3 and is connected from junction 67 to a point of potential +V. Resistor 49 is shown again in FIG. 3 and is connected between junctions 67 and 70. Capacitor 48 is shown again in FIG. 3 and is connected between junctions 69 and 70.

A diode 83 is connected from junction 68 to ground, and poled to be conductive in a direction toward ground.

Junction 69 is connected from junction 26.

In FIG. 3, if desired, junction 67 may be considered to be identical to junction 43 in FIG. 2. Similarly, junctions 70 and 71 in FIG. 3 may be considered to be identical to junction 42 in FIG. 2. Still further, junction 69 in FIG. 3 may be considered to be identical to junction 41 in FIG. 2.

Figure 4:
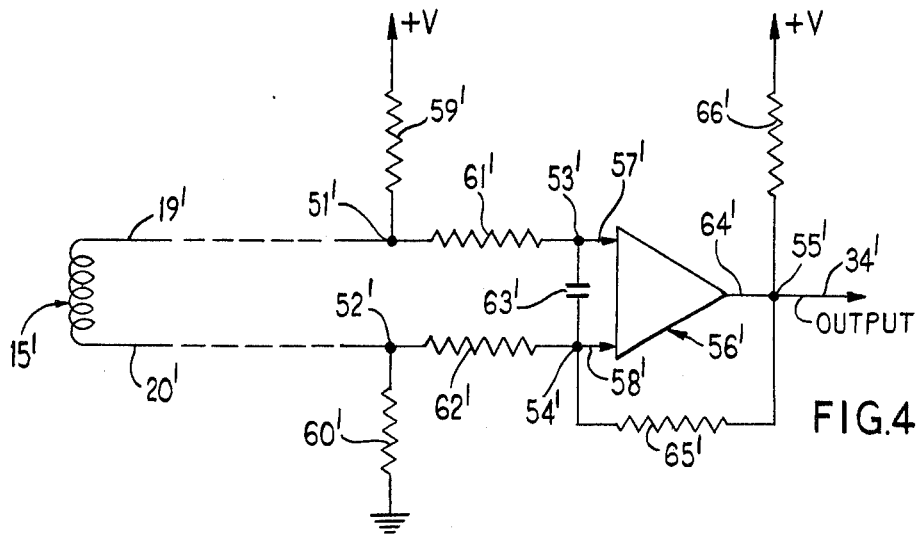
FIG. 4 is a schematic diagram of an alternative embodiment of the present invention.

An alternative embodiment is shown in FIG. 4. In FIG. 4, each structure illustrated at 15', 19', 20', 59', 51', 52', 60', 61', 62', 53', 54', 63', 57', 58', 56', 64', 65', 66', 55' and 34' may be identical to the respective structures 15, 19, 20, 59, 51, 52, 60, 61, 62, 53, 54, 63, 57, 58, 56, 64, 65, 66, 55 and 34 illustrated in FIG. 3. The common mode rejection circuit of FIG. 4 may be used with an anti-skid brake system or it may be used in any other or different systems or by itself. Note will be taken that the difference between the connection of the circuits 21 and 24 in FIG. 3 and the connection of the circuit of FIG. 4 is that the lower end of resistors 60 and 60'' in FIG. 3 are grounded at a virtual ground which is junction 26, whereas the lower end of resistor 60' in FIG. 4 is actually grounded.

The word "ground" is hereby defined for use in the claims to mean either a direct connection of a conductor to ground or a structure of a constant reference potential not ground, or a virtual ground.

The phrase "latching switch" is hereby defined for use in the claims to include either a self-locking relay or a latching electronic or transistor switch or other latching switch.

All the structures shown in FIG. 1 may be conventional except circuits 21 and 24, and detector 29.

As an example of the foregoing, air brake valve 32 may be that disclosed in copending application Ser. No. 359,653 filed May 14, 1973, by Roger Greenwood for COMBINATION VALVE, assigned to the assignee of this application. The entire contents of said copending application is, by this reference hereto, incorporated herein as though fully set forth herein hereat.

What is claimed is:

1. In noise suppression apparatus, the combination comprising: a signal source having first and second long output leads, said first and second leads having first and second outer ends, respectively, both of said outer ends being remote from said signal source; first and second junctions remote from said signal source and connected from said first and second outer ends, respectively, of the respective leads thereof; a first resistor connected from said first junction to a conductive point; a source of D.C. potential connected from said conductive point to ground; a second resistor connected from said second junction to ground; a differential amplifier having an inverting input lead, a non-inverting input lead and an output lead; a third resistor connected from said first junction to said inverting input lead; a fourth resistor connected from said second junction to said non-inverting input lead; a capacitor connected between said amplifier input leads; a fifth resistor connected from said amplifier output lead to said non-inverting input lead; a sixth resistor connected from said amplifier output lead to said point.

* * * * *